United States Patent
Li et al.

(10) Patent No.: US 10,396,061 B1
(45) Date of Patent: Aug. 27, 2019

(54) TRANSPARENT ELECTRONICS FOR INVISIBLE SMART DUST APPLICATIONS

(71) Applicant: International Business Machines Corporation, Armonk, NY (US)

(72) Inventors: Ning Li, White Plains, NY (US); Devendra K. Sadana, Pleasantville, NY (US); Stephen W. Bedell, Wappingers Falls, NY (US); Ghavam G. Shahidi, Pound Ridge, NY (US); Theodore van Kessel, Millbrook, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/928,873

(22) Filed: Mar. 22, 2018

(51) Int. Cl.
| | |
|---|---|
| *H01L 25/16* | (2006.01) |
| *H01L 23/538* | (2006.01) |
| *H01L 31/02* | (2006.01) |
| *H01L 31/12* | (2006.01) |
| *H01L 31/053* | (2014.01) |
| *H01L 33/62* | (2010.01) |
| *H01L 21/683* | (2006.01) |
| *H01L 21/768* | (2006.01) |

(Continued)

(52) U.S. Cl.
CPC ............ *H01L 25/167* (2013.01); *H01L 21/50* (2013.01); *H01L 21/6835* (2013.01); *H01L 21/76897* (2013.01); *H01L 21/78* (2013.01); *H01L 23/481* (2013.01); *H01L 23/4822* (2013.01); *H01L 23/5389* (2013.01); *H01L 31/02005* (2013.01); *H01L 31/053* (2014.12); *H01L 31/12* (2013.01); *H01L 33/62* (2013.01); *H01L 2221/68327* (2013.01); *H01L 2221/68381* (2013.01)

(58) Field of Classification Search
CPC ............... H01L 25/167; H01L 21/6835; H01L 31/02005; H01L 33/62; H01L 23/4822; H01L 23/5389; H01L 31/053; H01L 21/50; H01L 23/481
See application file for complete search history.

(56) References Cited

U.S. PATENT DOCUMENTS

| | | | |
|---|---|---|---|
| 6,590,346 B1 * | 7/2003 | Hadley | ............... H01L 23/5389 257/E21.705 |
| 8,003,981 B2 * | 8/2011 | Iwasaki | ............. H01L 29/78618 257/43 |

(Continued)

FOREIGN PATENT DOCUMENTS

CN 104977027 A 10/2015

OTHER PUBLICATIONS

Kenji Nomura et al., "Room-temperature fabrication of transparent flexible thin-film transistors using amorphous oxide semiconductors", Nature, vol. 432, Nov. 25, 2004, pp. 488-492.*

(Continued)

*Primary Examiner* — William Coleman
(74) *Attorney, Agent, or Firm* — Scully, Scott, Murphy & Presser, P.C.; Daniel P. Morris, Esq.

(57) ABSTRACT

Dust-sized and light transparent semiconductor chips are provided and are used in a transparent electronic system. The dust-sized and light transparent semiconductor chips are composed entirely of materials that are transparent to visible light. The dust-sized and light transparent semiconductor chips are used as a component of a transparent electronic system.

19 Claims, 8 Drawing Sheets

(51) Int. Cl.
    *H01L 21/50*     (2006.01)
    *H01L 23/48*     (2006.01)
    *H01L 23/482*     (2006.01)
    *H01L 21/78*     (2006.01)

(56) References Cited

U.S. PATENT DOCUMENTS

| | | | |
|---|---|---|---|
| 8,241,932 B1 * | 8/2012 | Yu | H01L 25/0753 257/E21.122 |
| 8,866,209 B2 | 10/2014 | Tang et al. | |
| 8,889,440 B2 | 11/2014 | Chen et al. | |
| 8,941,095 B2 * | 1/2015 | Song | H01Q 1/1271 174/257 |
| 9,182,859 B2 * | 11/2015 | Coulson | G06F 3/044 |
| 9,432,021 B2 | 8/2016 | Johnson | |
| 9,763,320 B2 * | 9/2017 | Naito | H01L 33/486 |
| 9,786,769 B2 | 10/2017 | Aleksov | |
| 2011/0311722 A1 | 12/2011 | Faris | |
| 2014/0048799 A1 * | 2/2014 | Tour | H01L 27/2463 257/43 |
| 2016/0276321 A1 * | 9/2016 | Maki | H05K 1/185 |
| 2017/0194298 A1 * | 7/2017 | Negley | H05B 33/0803 |
| 2017/0350241 A1 | 12/2017 | Shi et al. | |

OTHER PUBLICATIONS

Liszewski, A., "Transparent Batteries That Charge in the Sun Could Replace Smartphone Screens", Sep. 1, 2015, 3 pages, http://gizmodo.com/transparent-batteries-that-charge-in-the-sun-could-repl-1727951349.

Sailor, M. J., et al., ""Smart dust": nanostructured devices in a grain of sand", Chem. Comm., The Royal Society of Chemistry 2005, First published as an Advance Article on the web Feb. 10, 2005, pp. 1375-1383.

Cook, B. W., et al., "SoC Issues for RF Smart Dust", Proceedings of the IEEE, Jun. 2006, pp. 1177-1196, vol. 94, No. 6.

Liou, S., "Standford transparent batteries: seeing straight through to the future?", Stanford Report, Jul. 25, 2011, 5 pages, http://news.stanford.edu/news/2011/july/transparent-litiumion-battery-072511.html.

Cross, T., "Vanishing point: the rise of the invisible computer", Jan. 26, 2017, 10 pages, https://www.theguardian.com/technology/2017/jan/26/vanishing-point-rise-invisible-computer.

Warneke, B., et al., "Smart Dust: Communicating with a Cubic-Millimeter Computer", Computer, Jan. 2001, pp. 44-45, vol. 34, Issue 1.

\* cited by examiner

TRANSPARENT ELECTRONICS FOR INVISIBLE SMART DUST APPLICATIONS

BACKGROUND

The present application relates to dust-sized semiconductor chips (i.e., semiconductor nanochips) that are composed entirely of materials that are invisible to visible light and thus the human eye, as well as transparent electronic systems that include such dust-sized semiconductor chips.

In computing technology, there has been, and continues to be, a demand to decrease the size of the computing device, to increase connectivity, and/or to enhance interaction with the physical world. Recently, the popularity of small computing devices (such as, for example, cell phones, laptops, notebooks, watches, medical devices, etc.), rapid increase of Internet growth, and the diminishing size and costs of sensors such as, for example, transistors, have accelerated the aforementioned demands. The advent of small computing elements provides enriched opportunities to reshape interactions between people and computers and spur everlasting computing research.

Smart Dust is one type of technology that has emerged from such computing research. The term "Smart Dust" describes a wide range of wireless sensor network hardware at a small scale down to a handful of cubic millimeters. Each wireless sensor node, or "mote", contains one or more sensors, hardware for computation and communication, and a power supply. Motes are typically autonomous, programmable, and able to participate in multihop mesh communication.

Smart Dust can be used in various applications including, for example, defense applications such as the deployment of defense networks rapidly by unmanned aerial vehicles or artillery. Due to the above, there is an ongoing demand for improvements in Smart Dust technology.

SUMMARY

Dust-sized and light transparent semiconductor chips are provided and are used as a component of a transparent electronic system. The term "dust-sized" is used throughout the present application to denote a semiconductor nanochip or other active element/component of an electronic system whose size, i.e., dimension, is 5 cubic millimeters or less. The term "transparent" when used in conjugation with the terms "semiconductor chips", "element" and "electronic system" denotes a chip, element or electronic system that is invisible to visible light and thus cannot be seen by a human eye. The transparent semiconductor nanochips and the transparent electronic system of the present application are entirely composed of materials that are transparent.

In one aspect of the present application, a transparent semiconductor nanochip is provided. In one embodiment, the transparent semiconductor nanochip includes a transparent substrate, a transparent semiconductor material layer located on a surface of the transparent substrate and including one or more transparent semiconductor devices disposed thereon, and a transparent back-end-of-the line (BEOL) structure located on the transparent semiconductor material layer. The transparent semiconductor nanochip is dust-sized, as defined above.

In another aspect of the present application, a transparent electronic system is provided. In one embodiment, the transparent electronic system includes a transparent semiconductor nanochip having processor functions, a transparent semiconductor nanochip having memory functions, at least one transparent communication element, and at least one transparent energy harvesting element, wherein each transparent semiconductor nanochip, the at least one transparent communication element, and the at least one transparent energy harvesting element are spaced apart from each other and are dust-sized, as defined above.

In a further aspect, a method of forming a transparent semiconductor nanochip is provided. In one embodiment, the method may include providing a semiconductor-on-insulator substrate comprising a transparent semiconductor layer having one or more transparent semiconductor devices disposed thereon. A transparent back-end-of-the-line (BEOL) structure is formed on a first surface of the transparent semiconductor material layer. A second surface of the transparent semiconductor layer that is opposite the first surface is then physically exposed and thereafter the second surface of the transparent semiconductor material layer is bonded to a transparent substrate to provide a bonded structure. The bonded structure is then singulated to provide a plurality of transparent semiconductor nanochips, wherein each transparent semiconductor nanochip includes a remaining sub-unit portion of the transparent substrate, a remaining sub-unit portion of the transparent semiconductor material layer comprising the one or more transparent semiconductor devices disposed thereon, and a remaining sub-unit portion of the transparent back-end-of-the line (BEOL) structure. Each semiconductor nanochip is dust-sized, as defined above.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
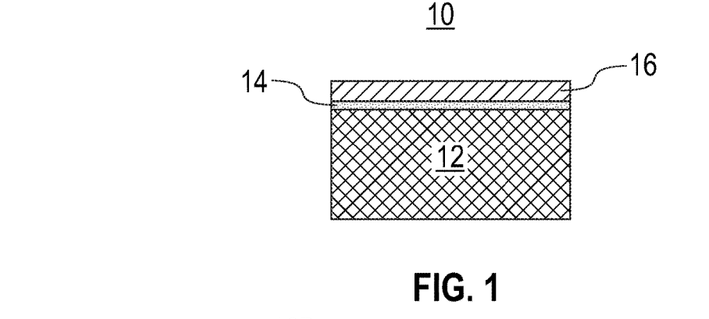
FIG. 1 is a cross sectional view of an exemplary transparent semiconductor nanochip that can be employed in accordance with an embodiment of the present application.

Referring first to FIG. 1, there is illustrated an exemplary transparent semiconductor nanochip 10 that can be employed in accordance with an embodiment of the present application. The exemplary transparent semiconductor nanochip of FIG. 1 includes a transparent substrate 12, a transparent semiconductor material layer 14 located on a surface of the transparent substrate 10 and including one or more transparent semiconductor devices (not shown specifically shown) disposed thereon, and a transparent back-end-of-the line (BEOL) structure 16 located on the transparent semiconductor material layer 14.

In accordance with the present application, the transparent semiconductor nanochip 10 of the present application is dust-sized. By "dust-sized" it is meant that the transparent semiconductor nanochip 10 has a size (i.e., dimension) of 5 cubic millimeters or less. The transparent semiconductor nanochip 10 that can be used in the present application may have a vertical thickness, i.e., height, from 10 µm to 200 µm, with a vertical thickness from 50 µm to 100 µm being more typical. The transparent semiconductor nanochip 10 that can be used in the present application may have a width, as measured from one sidewall to an opposing sidewall, from 10 µm to 5 millimeters, with a width from 100 µm to 0.5 millimeters being more typical. The transparent semiconductor nanochip 10 that can be used in the present application may have a length, as measured from one sidewall to an opposing sidewall, from 10 µm to 5 millimeters, with a length width from 50 µm to 0.5 millimeters being more typical.

The transparent substrate 12 that can be employed in the exemplary transparent semiconductor nanochip 10 of FIG. 1 includes any material that is inherently transparent to visible light. Examples of materials that can be used as the transparent substrate 12 of the exemplary transparent semiconductor nanochip of FIG. 1 include, but are not limited to, sapphire, aluminum nitride (AlN), or quartz. The transparent substrate 12 that can be used in the present application may have a vertical thickness, i.e., height, from 20 µm to 1000 µm, with a vertical thickness from 50 µm to 200 µm being more typical.

The transparent semiconductor material layer 14 includes any material having semiconducting properties (i.e., a semiconductor material) that is either inherently transparent to visible light, or physical transparent to visible light by having a thickness which allows visible light to transmit through the material with little or no wavelength decay. Examples of semiconductor materials that can be used as the transparent semiconductor material layer 14 include, but are not limited to, silicon, germanium, a silicon germanium alloy, a III-V compound semiconductor, or a II-VI compound semiconductor. The transparent semiconductor material layer 14 may be single layered or multilayered. In some embodiments, the transparent semiconductor material layer 14 is composed of a single crystalline semiconductor material such as, for example, single crystalline silicon. The transparent semiconductor material layer 14 that can be used in the present application may have a vertical thickness, i.e., height, of less than 100 nm, with a vertical thickness of from 10 nm to 80 nm being more typical.

As mentioned above, the transparent semiconductor material layer 14 contains one or more semiconductor devices disposed thereon. The one or more semiconductor devices are also transparent and may include, for example, transistors, capacitors, and/or resistors. The one or more semiconductor devices are composed entirely of materials (semiconductor materials as defined above, dielectrics and/or conductors) that are transparent. Transparent dielectrics that can be used as the device level include, for example, $SiO_2$, SiN, $Al_2O_3$, or $HfO_2$. Transparent conductors that can be used as the device level include, for example, aluminum doped zinc oxide, indium tin oxide, or fluorine doped SnO. The one or more semiconductor devices may be formed utilizing well known front-end-of-the-line processing technology.

The one of more semiconductor devices can be configured to provide a device that provides processor functions (computing) or memory functions.

The transparent back-end-of-the line (BEOL) structure 16 that can be used in the exemplary transparent semiconductor nanochip 10 of FIG. 1 includes at least one interconnect level that includes at least one electrically conductive and transparent metallic structure embedded within a transparent interconnect dielectric material layer. The electrically conductive and transparent metallic structures may be a metallic line, a metallic via, and/or a combined metallic via/line. The electrically conductive and transparent metallic structure includes an electrically conductive and transparent metal or metal alloy such as, for example, aluminum doped zinc oxide, indium tin oxide, fluorine doped SnO. The transparent interconnect dielectric material layer may include $SiO_2$.

The transparent back-end-of-the line (BEOL) structure 16 can be formed utilizing well known BEOL processing including for example, a single damascene or a dual damascene process. The transparent back-end-of-the line (BEOL) structure 16 provides a connection between the one or more semiconductor devices disposed on the transparent semiconductor material layer 14 and the outside world. The transparent back-end-of-the line (BEOL) structure 16 that can be used in the present application may have a vertical thickness, i.e., height, from 0.1 µm to 20 µm, with a vertical thickness from 1 µm to 10 µm being more typical.

The exemplary transparent semiconductor nanochip 10 of FIG. 1 can be formed by providing a wafer of a transparent substrate material, then forming a layer of a transparent semiconductor material on the transparent substrate material, forming the one or more semiconductor devices on the layer of transparent semiconductor material, forming at least one interconnect level above the layer of transparent semiconductor material containing the one or more semiconductor devices, and thereafter performing a singulation process. FIGS. 4-11, which will be described in greater detail herein below, provide one exemplary embodiment of a method that can be used to provide the exemplary transparent semiconductor nanochip 10 of FIG. 1 which includes the aforementioned processing steps.

Figure 2:
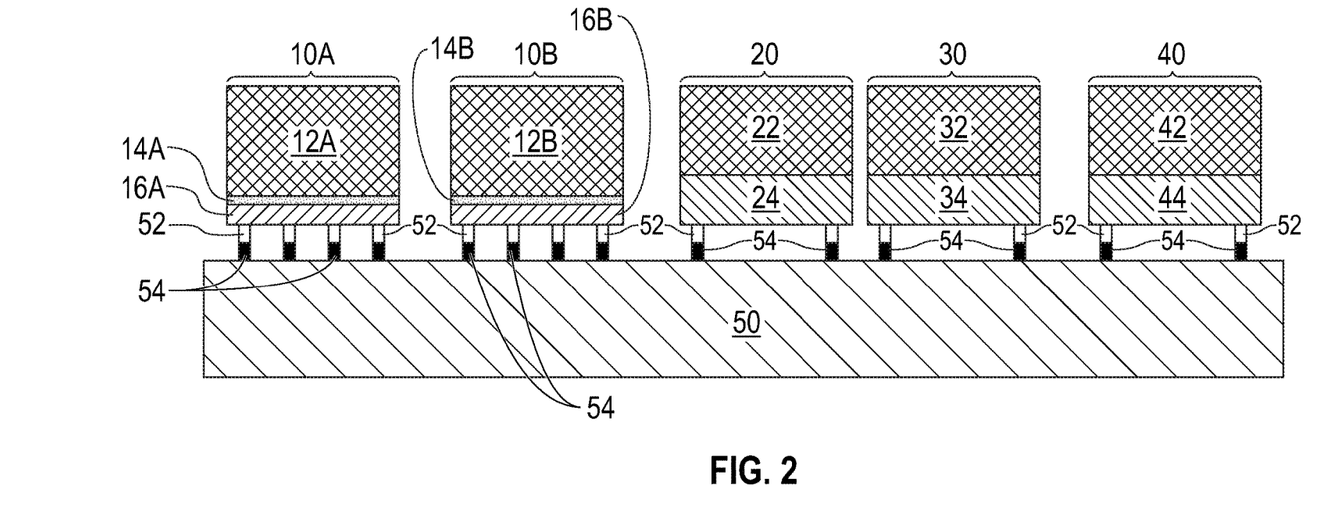
FIG. 2 is a cross sectional view of an exemplary transparent electronic system that can be employed in accordance with an embodiment of the present application.

Referring now to FIG. 2, there is illustrated an exemplary transparent electronic system that can be employed in accordance with an embodiment of the present application. The transparent electronic system of FIG. 2 includes a transparent semiconductor nanochip 10A having processor functions, a transparent semiconductor nanochip 10B having memory functions, at least one transparent communication element 30, and at least one transparent energy harvesting element (20, 40). In accordance with the present application, each transparent semiconductor nanochip (10A, 10B), the at least one transparent communication element 30, and the at least one transparent energy harvesting element (20, 40) are spaced apart from each other and are dust-sized, as defined above. The number of transparent semiconductor nanochips having processor functions, the number of transparent semiconductor nanochips having memory functions, the number of transparent communication elements and the number of transparent energy harvesting elements that can be used in the present application are not limited to the number described and illustrated herein.

In this embodiment, each transparent semiconductor nanochip (10A, 10B), the at least one transparent communication element 30, and the at least one transparent energy harvesting element (20, 40) are in a side-by-side, i.e., lateral, configuration. In this configuration, the location of the transparent semiconductor nanochips (10A, 10B), the at least one transparent communication element 30, and the at least one transparent energy harvesting element (20, 40) may vary from the order shown in FIG. 2 of the present application.

As shown in FIG. 2, each transparent semiconductor nanochip (10A, 10B), the at least one transparent communication element 30, and the at least one transparent energy harvesting element (20, 40) are present on a surface of a transparent base substrate 50. As also shown in FIG. 2, each transparent semiconductor nanochip (10A, 10B), the at least one transparent communication element 30, and the at least one transparent energy harvesting element (20, 40) includes bond pads 52 which are bonded to a bond pads 54 present on the surface of the transparent base substrate 50. Each bond pad 52 and each bond pad 54 are composed of a transparent bond pad material such as, for example, ZnO, or ITO. In some embodiments, elements 52 and 54 may include an ultra-thin (20 nm or less) layer of solder, e. g., Sn.

The transparent base substrate 50 may include one of the transparent substrate materials mentioned above for transparent substrate 12. The transparent base substrate 50 may have a vertical thickness, i.e., height, from 20 µm to 1000 µm, with a vertical thickness from 50 µm to 200 µm being more typical. The transparent base substrate 50 that can be used in the present application may have a width, as measured from one sidewall to an opposing sidewall, from 20 µm to 5 millimeters, with a width from 100 µm to 1 millimeters being more typical. The transparent base substrate 50 that can be used in the present application may have a length, as measured from one sidewall to an opposing sidewall, from 20 µm to 5 millimeters, with a length width from 100 µm to 1 millimeters being more typical.

The term "communication element" is used throughout the present application to denote any device, structure, or material that can transmit a signal to the outside world. In one embodiment of the present application, the transparent communication element 30 may include a transparent light emitting diode (LED) 34 located on a surface of a transparent substrate 32 (transparent substrate 32 may include one of the materials mentioned above for transparent substrate 12). As known to those skilled in the art, a LED is a two-lead semiconductor light source that contains a p-n junction that emits light when activated. That is, when a suitable current is applied to the LED, electrons are able to recombine with electron holes within the device, releasing energy in the form of photons. This effect is called electroluminescence and the color of the light (corresponding to the energy of the photon) is determined by the energy band gap of the semiconductor materials employed.

The transparent LED 34 that can be used in the present application as the transparent communication element 30 includes a first transparent semiconductor material that has a first conductivity type (p-type or n-type) and a second transparent semiconductor material that has a second conductivity type (p-type or n-type) that is opposite to the first conductivity type such that a p-n junction is present between the first and second transparent semiconductor materials. The term "p-type" refers to the addition of impurities to an intrinsic semiconductor material that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The first and second transparent semiconductor materials may include one of the transparent semiconductor materials mentioned above. The transparent communication element 30 can be formed utilizing techniques well known to those skilled in the art.

The term "energy harvesting element" denotes any device, structure, or material that is capable of generating and, in some embodiments, storing energy. Examples of transparent energy harvesting elements that can be used in the present application are transparent photovoltaic cells and/or transparent batteries. FIG. 2 illustrated an embodiment, in which two energy harvesting elements (20, 40) are used. In the illustrated embodiment, energy harvesting element 20 includes a transparent photovoltaic cell 24 located on transparent substrate 22 (transparent substrate 22 may include one of the materials mentioned above for transparent substrate 12), and energy harvest element 40 includes a transparent battery 44 located on a transparent substrate 42 (transparent substrate 42 may include one of the materials mentioned above for transparent substrate 12).

As is known to those skilled in the art, a photovoltaic cell is an electrical device that converts the energy of light directly into electricity by the photovoltaic effect. The transparent photovoltaic cell 24 of the present application is composed of semiconductor materials that have the ability to absorb light such as, for example, crystalline silicon, monocrystalline silicon, polysilicon, amorphous silicon, GaN, CdTe, or CIGS (i.e., copper indium selenide). The transparent photovoltaic cell 24 can be formed utilizing conventional solar cell processing techniques.

The transparent battery 24 that may be employed in the present application includes a transparent anode collector, a transparent anode region, a transparent electrolyte, a transparent cathode material, and a transparent cathode current collector. The transparent battery 24 may be formed utilizing techniques well known to those skilled in the art.

Figure 3:
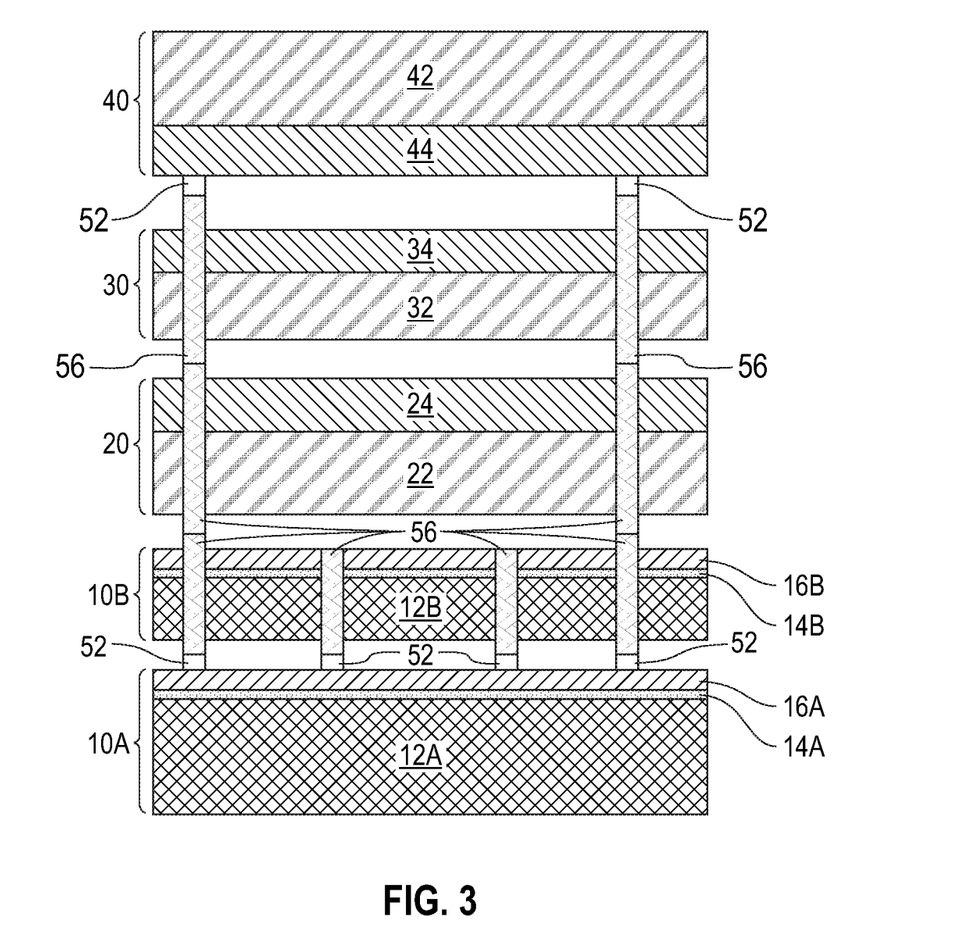
FIG. 3 is a cross sectional view of another exemplary transparent electronic system that can be employed in accordance with an embodiment of the present application.

Referring now to FIG. 3, there is illustrated an exemplary transparent electronic system that can be employed in accordance with another embodiment of the present application. The transparent electronic system of FIG. 3 includes a transparent semiconductor nanochip 10A having processor functions, a transparent semiconductor nanochip 10B having memory functions, at least one transparent communication element 30, and at least one transparent energy harvesting element (20, 40). In accordance with the present application, each transparent semiconductor nanochip (10A, 10B), the at least one transparent communication element 30 device, and the at least one transparent energy harvesting element (20, 40) device are spaced apart from each other and are dust-sized, as defined above.

In this embodiment, each transparent semiconductor nanochip (10A, 10B), the at least one transparent communication element 30, and the at least one transparent energy harvesting element (20, 40) are in a vertically stacked configuration. The order of elements within the vertical stack may vary provided that an element having a longer wavelength is located atop an element having a shorter wavelength. The number of transparent semiconductor nanochips having processor functions, the number of transparent semiconductor nanochips having memory functions, the number of transparent communication elements, and the number of transparent energy harvesting elements are not limited to the number shown in FIG. 3.

In the stack configuration, through-substrate vias (TSVs) 56 composed of a transparent conductive material) are formed into the elements that located between the topmost element and the bottom element of the stacked transparent electronic system. The TSVs 56 are formed utilizing techniques well known to those skilled in the art. Bond pads 52 are present on the topmost element and the bottommost element of the stacked transparent electronic system as shown in FIG. 3. A solder as defined above may also be used.

FIGS. 4-11, which will now be described in greater detail, illustrate one method that can be used in forming a transparent semiconductor nanochip 12 in accordance with the present application and as shown in FIG. 1. The illustrated method begins by providing a semiconductor-on-insulator (SOI) substrate 100 that is exemplified in FIG. 4. The SOI substrate 100 includes a topmost semiconductor material layer 106 processed to include one or more semiconductor devices (not shown) that can be used in forming a transparent semiconductor nanochip 10 in accordance with an embodiment of the present application. The topmost semiconductor material layer 106 of the SOI substrate 100 includes a transparent semiconductor material such as, for example, silicon. The topmost semiconductor material layer 106 has a thickness of less than 100 nm. In one embodiment, the topmost semiconductor material layer 106 has a thickness from 20 nm to 80 nm. The at least one semiconductor devices are also transparent and include one of the semiconductor devices mentioned above for the transparent semiconductor nanochip 10 shown in FIG. 1 of the present application.

Figure 4:
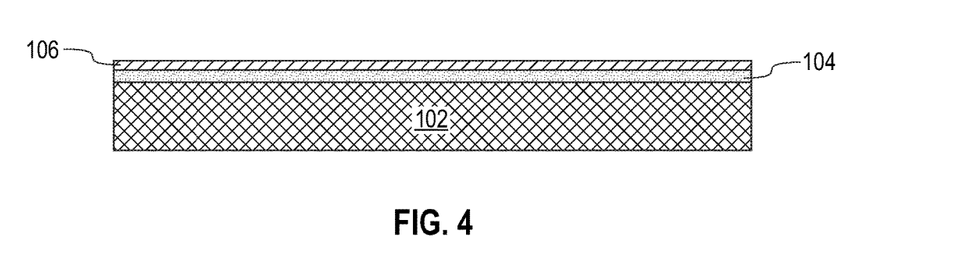
FIG. 4 is a cross sectional view of a semiconductor-on-insulator (SOI) substrate including a topmost semiconductor material layer processed to include one or more semiconductor devices that can be used in forming a transparent semiconductor nanochip in accordance with an embodiment of the present application.

The SOI substrate 100 also includes an insulator layer 104 and a handle substrate 102. As is shown, that insulator layer 104 of the SOI substrate 100 is located between the topmost semiconductor material layer 106 and the handle substrate 102. Handle substrate 102 may include any semiconductor material such as, for example, silicon. The insulator layer 104 of the SOI substrate 100 may include an oxide and/or nitride. In one example, insulator layer 104 is composed of silicon dioxide. SOI substrate 100 may be formed utilizing any well known technique including, for example, a SIMOX process, or a layer transfer process.

In this embodiment, the handle substrate 102 that is employed in the present application has a fracture toughness that is less than that of a stress inducing material to be subsequently formed. Fracture toughness is a property which describes the ability of a material containing a crack to resist fracture. Fracture toughness is denoted $K_{Ic}$. The subscript k denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero. Fracture toughness is a quantitative way of expressing a material's resistance to brittle fracture when a crack is present.

Figure 5:
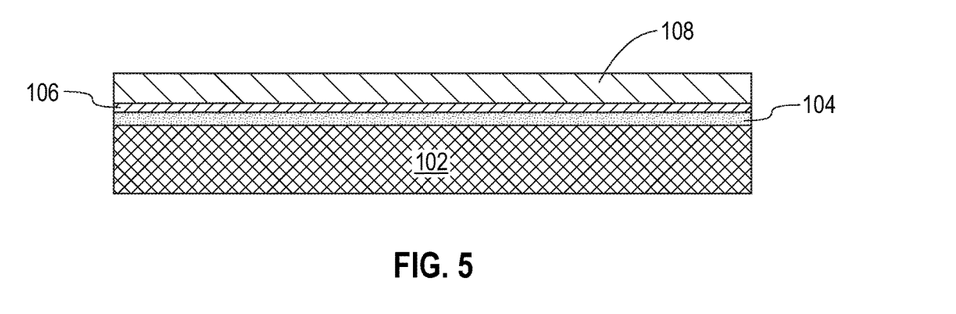
FIG. 5 is a cross sectional view of the semiconductor-on-insulator substrate of FIG. 4 after forming a transparent back-end-of-the-line (BEOL) structure above the topmost semiconductor material layer of the SOI substrate.

Referring now to FIG. 5, there is illustrated the SOI substrate 100 of FIG. 4 after forming a transparent back-end-of-the-line (BEOL) structure 108 above the topmost semiconductor material layer 106 of the SOI substrate 100. The BEOL structure 108 includes at least one interconnect level that contains at least one transparent interconnect dielectric material, as defined above, having one or more electrically conductive and transparent metallic structures, as defined above, embedded therein. The BEOL structure 108 can be formed utilizing any conventional BEOL process such as, for example, single damascene or dual damascene.

Figure 6:
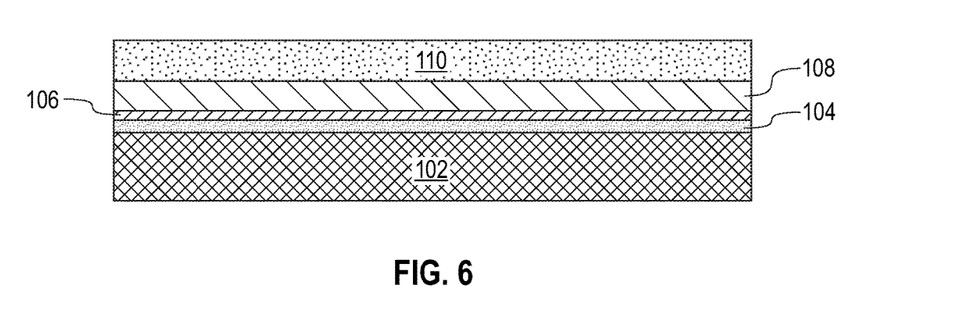
FIG. 6 is a cross sectional view of the exemplary semiconductor structure of FIG. 5 after forming a stressor layer on a topmost surface of the transparent BEOL structure.

Referring now to FIG. 6, there is illustrated the exemplary semiconductor structure of FIG. 5 after forming a stressor layer 110 on a topmost surface of the transparent BEOL structure 108. Stressor layer 110 is composed of a stress inducing metal-containing material. In accordance with the present application, stressor layer 110 has a critical thickness and a stress value that cause spalling mode fracture to occur within the handle substrate 102. In particular, stressor layer 110 has a critical thickness in which spalling is initiated somewhere in between the topmost and bottommost surface of the handle substrate 102. By 'critical', it is meant that for a given stress inducing material and handle substrate combination, a thickness value and a stressor value for the stressor layer 110 is chosen that render spalling mode fracture possible. In some embodiments, the stress value can be adjusted by tuning the deposition conditions of the stress inducing metal-containing material that provides stressor layer 110. For example, in the case of sputter deposition of stress inducing metal-containing material that provides the stressor layer 110, the gas pressure can be used to tune the stress value.

The thickness of the stressor layer 110 is chosen to provide the desired fracture depth somewhere within the handle substrate 102. For example, if the stress inducing material that provides the stressor layer 110 is chosen to be Ni, then fracture will occur at a depth below the stressor layer 110 roughly 2 to 3 times the Ni thickness. The stress value for the stress inducing material that provides the stressor layer 110 is then chosen to satisfy the critical condition for spalling mode fracture. This can be estimated by inverting the empirical equation given by $t^*=[(2.5\times10^6)(K_{IC}^{3/2})]/\sigma^2$, where $t^*$ is the critical stressor layer thickness (in microns), $K_{IC}$ is the fracture toughness (in units of MPa·m$^{1/2}$) of the handle substrate 102 and a is the stress value of the stress inducing material that provides the stressor layer 110 (in MPa or megapascals). The above expression is a guide, in practice, spalling can occur at stress or thickness values up to 20% less than that predicted by the above expression.

The stress inducing metal-containing material that can provide the stressor layer 110 may include, for example, Ni, Cr, Fe, Mo, Ti or W. Alloys of these metals can also be employed. In one embodiment, the inducing metal-containing material that provides stressor layer 110 includes at least one layer consisting of Ni.

The stress inducing metal-containing material that can provide the stressor layer 110 can be formed utilizing a deposition process, such as, for example, sputtering, chemical vapor deposition, plasma enhanced chemical vapor deposition, chemical solution deposition, physical vapor deposition, or plating. The deposition of the stress inducing metal-containing material that can provide the stressor layer 110 may be performed at a temperature from room temperature (15° C.-40° C.) to 60° C. Other deposition temperatures are possible so long as the selected deposition temperature does not cause spontaneous spalling of the handle substrate 102.

Figure 7:
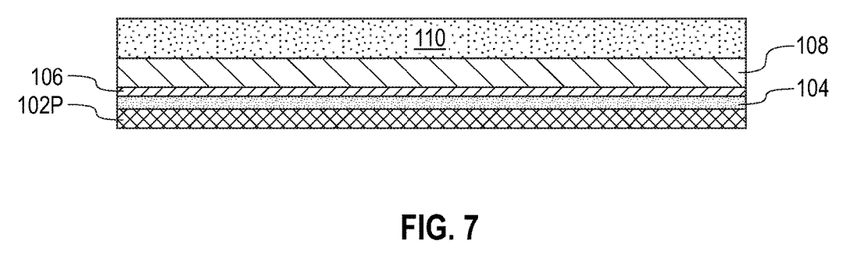
FIG. 7 is a cross sectional view of the exemplary semiconductor structure of FIG. 6 after removing a portion of the handle substrate of the SOI substrate utilizing a spalling process.

Referring now to FIG. 7, there is illustrated the exemplary semiconductor structure of FIG. 6 after removing a portion of the handle substrate 102 of the SOI substrate 100 utilizing a spalling process. A spalled handle substrate portion 102P remains attached to the insulator layer 104. The term "spalling" is used throughout the present application to denote a material removal process in which a stressor material induces crack formation and propagation within an underlying material whose fracture toughness is less than the stressor layer. In one embodiment of the present application, a handle substrate (not shown) can be formed atop the stressor layer 110 prior to spalling and the spalling process includes pulling or peeling the handle substrate to provide a spalled handle substrate portion 102P.

In one embodiment, spalling can be initiated at room temperature (i.e., 15° C. to 40° C.). In other embodiments, spalling can be performed at a temperature from 100° C. and below. In some embodiments of the present application, spalling can be initiated by lowering the temperature at a fixed continuous rate. By "fixed continuous rate" it is mean, for example, 20° C. per second utilizing an electronically controlled cooling table or chamber. This method of cooling allows one to reach a pre-specified temperature at which user-defined spalling initiation can induce a pre-determined spalling depth that may be different than that dictated by mere structural parameters (i.e., stressor layer stress and thickness, and fracture toughness of substrate).

The thickness of the spalled handle substrate portion 102P that can be removed from the handle substrate 102 varies depending on the material of the stressor layer 110 and the semiconductor material of the handle substrate 102. In one embodiment, the spalled handle substrate portion 102P has a thickness of less than 100 microns.

Figure 8:
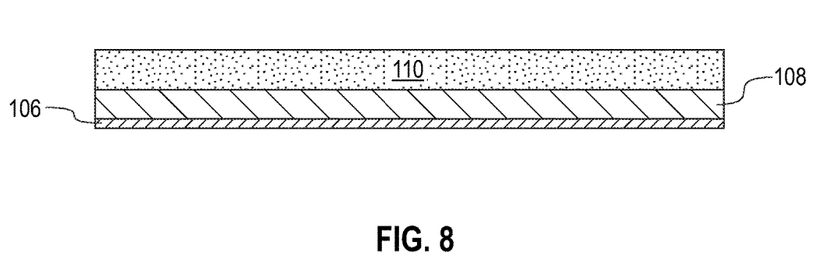
FIG. 8 is a cross sectional view of the exemplary semiconductor structure of FIG. 7 after removing the remaining portion of the handle substrate and the buried insulator layer of the SOI substrate.

Referring now to FIG. 8, there is illustrated the exemplary semiconductor structure of FIG. 7 after removing the spalled handle substrate portion 102P and the buried insulator layer 104. The spalled handle substrate portion 102P and the buried insulator layer 104 can be removed utilizing one or more material removal process such, as for example, chemical mechanical polishing and/or etching. The removal of the spalled handle substrate portion 102P and the buried insulator layer 104 physically exposes a surface of the topmost semiconductor layer 106 of the original SOI substrate 100 that is opposite the surface of the topmost semiconductor material layer 106 containing the one or more semiconductor devices.

Figure 9:
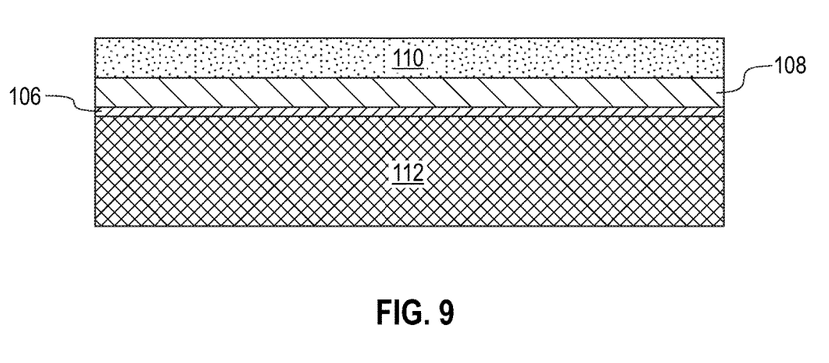
FIG. 9 is a cross sectional view of the exemplary semiconductor structure of FIG. 8 after bonding a physically exposed surface of the topmost semiconductor layer to a transparent substrate.

Referring now to FIG. 9, there is illustrated the exemplary semiconductor structure of FIG. 8 after bonding the physically exposed surface of the topmost semiconductor layer 106 to a transparent substrate 112. Transparent substrate 112 includes one of the materials mentioned above for transparent substrate 12. Bonding may be achieved by bringing the exposed surface of the topmost semiconductor layer 106 to an exposed surface of the transparent substrate 112, and then performing a bonding anneal step. The temperature of the bonding anneal may be from 100° C. to 450° C.

Figure 10:
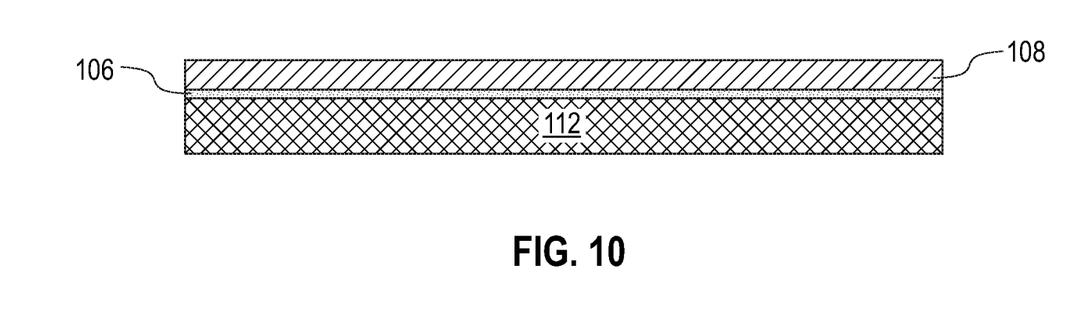
FIG. 10 is a cross sectional view of the exemplary semiconductor structure of FIG. 9 after removing the stressor layer.

Referring now to FIG. 10, there is illustrated the exemplary semiconductor structure of FIG. 9 after removing the stressor layer 110. The stressor layer 110 can be removed from the BEOL structure 108 utilizing any material removal processes such, as for example, chemical mechanical polishing or etching.

In some embodiments, the structure shown in FIG. 10 can be formed without utilizing a spalling process. For example, the exemplary structure shown in FIG. 5 can be first formed, and thereafter one or more material removal process can be used to remove the handle substrate 102 and the insulator layer 104. The exposed surface of the topmost semiconductor layer 106 can then be bonded to a transparent substrate 112 providing the structure shown in FIG. 10.

Figure 11:
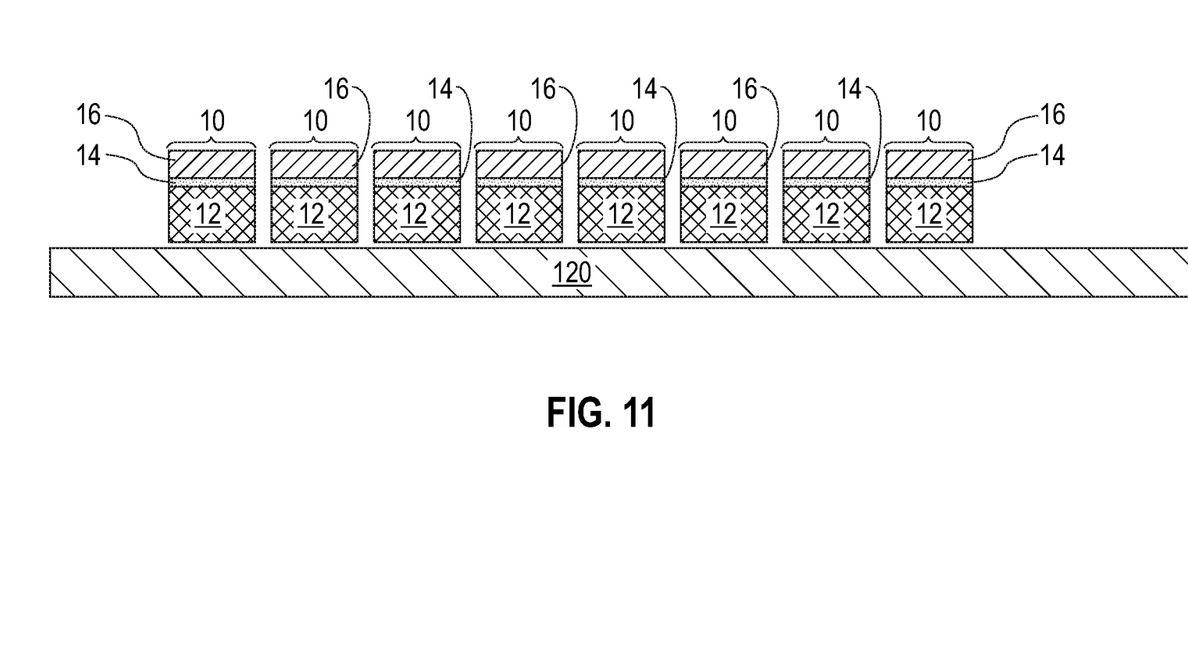
FIG. 11 is a cross sectional view of the exemplary semiconductor structure after performing a singulation process to provide a plurality of transparent semiconductor nanochips.

Referring now to FIG. 11, there is illustrated the exemplary semiconductor structure after performing a singulation process to provide a plurality of transparent semiconductor nanochips 10. Each transparent semiconductor nanochips 10 contains a remaining sub-unit portion of the transparent BEOL structure (now element 16), a remaining sub-unit portion of the topmost semiconductor material layer 106 (now element 14) and a remaining sub-unit portion of the transparent substrate 112 (now element 12).

Figure 12:
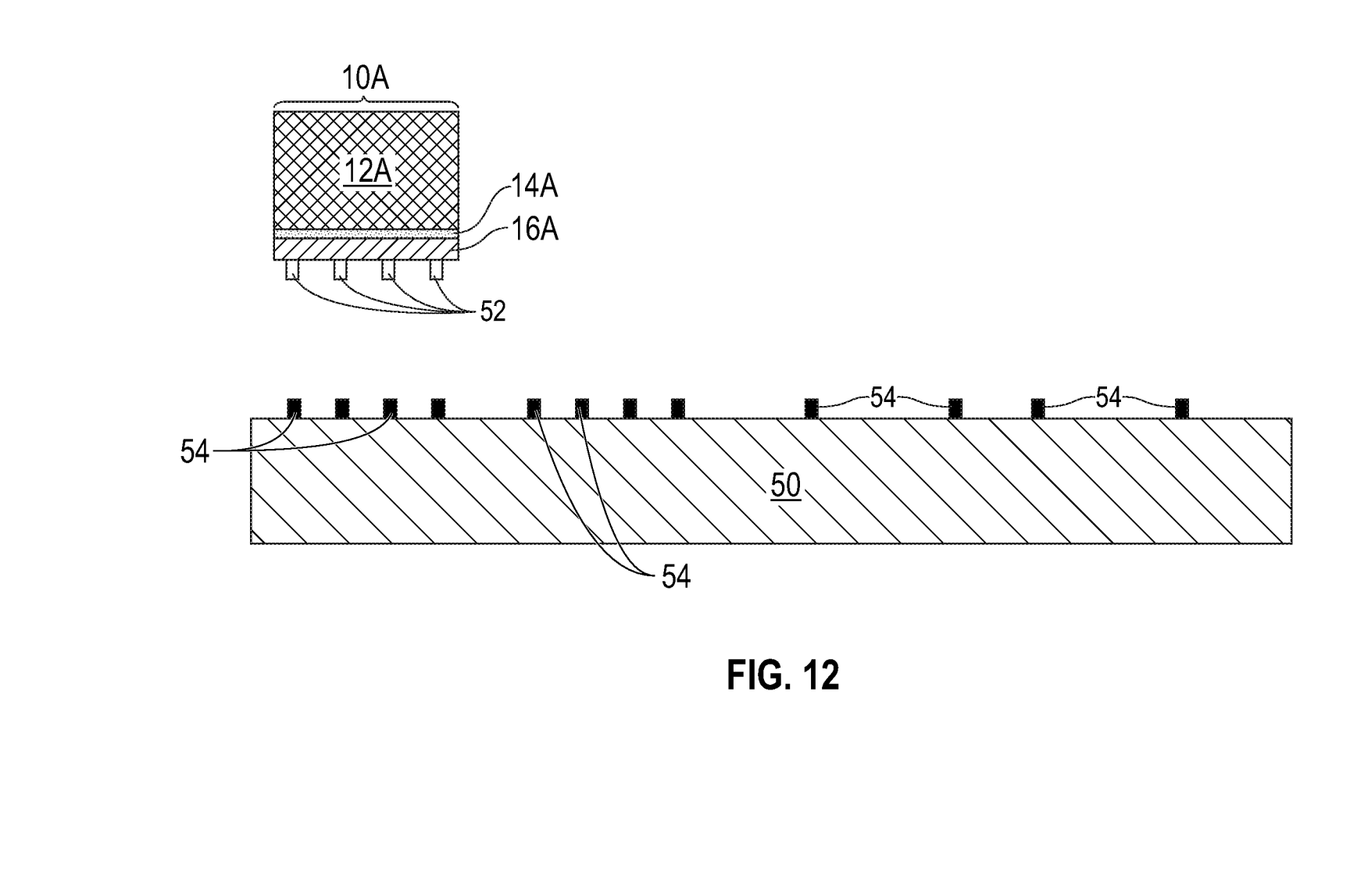
FIG. 12 is a cross sectional view during an early stage of fabricating the exemplary transparent electronic system of FIG. 2.
Figure 13:
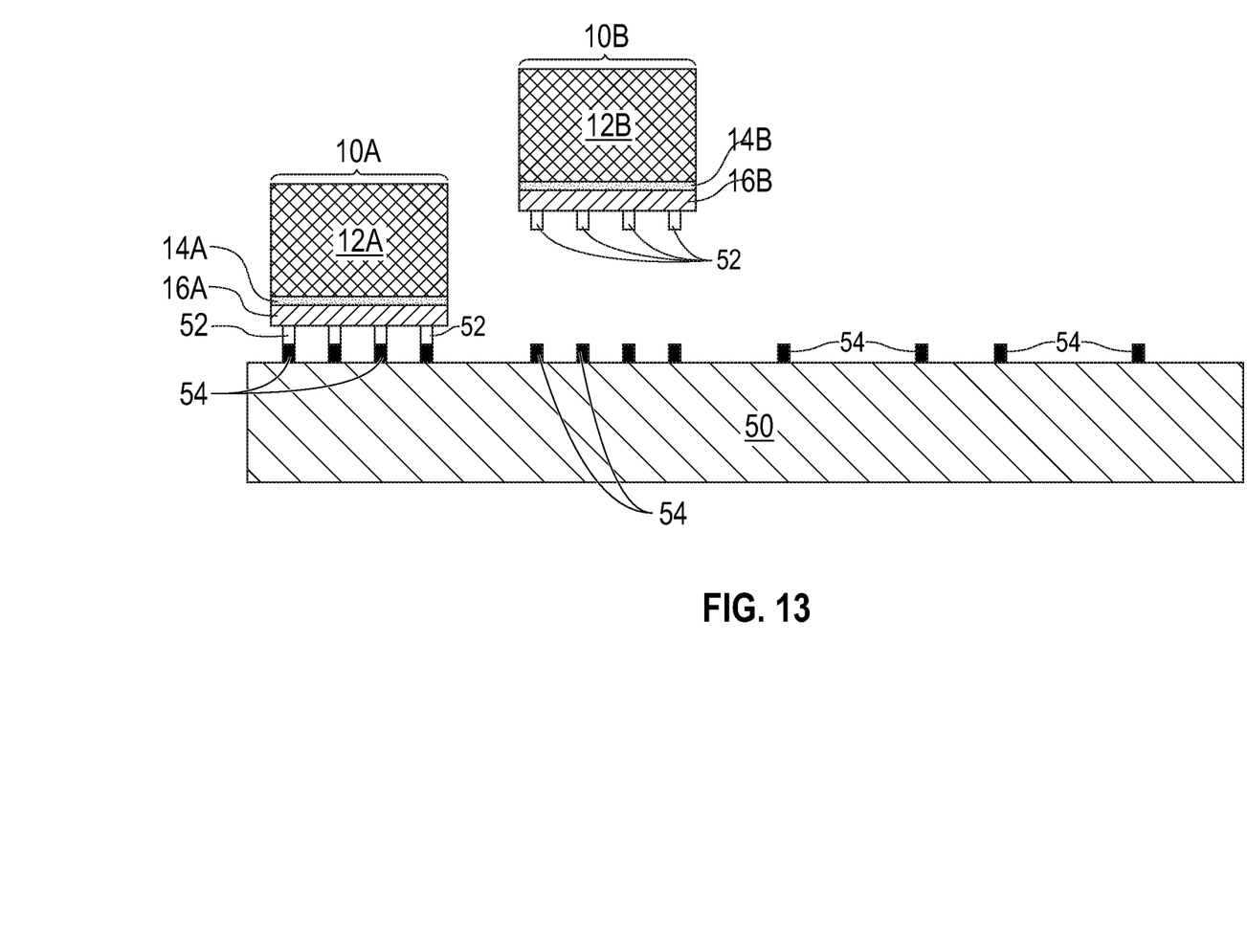
FIG. 13 is a cross sectional view of structure shown in FIG. 12 during another stage of fabricating the exemplary transparent electronic system of FIG. 2.

Referring now to FIGS. 12-13, there are illustrated processing steps that can be used in providing the transparent electronic system of FIG. 2. Notably, FIG. 12 illustrates an early stage of the process in which transparent semiconductor nanochip 10A having processor functions and transparent bond pads 52 is first provided and brought into proximity to transparent base substrate 50 that contains transparent bond pads 54. The transparent bond pads 52, 54 can be formed by depositing of a transparent bond pad material and thereafter patterning the transparent bond pad material.

Next, and as shown in FIG. 13, the transparent semiconductor nanochip 10A having processing functions is bonded to the transparent base substrate 50 utilizing a bonding anneal as described above. Bonding occurs between bond pads 52 and 54. FIG. 13 also shows an initial stage of bonding a transparent semiconductor nanochip 10B having memory functions and transparent bond pads 52 to transparent base substrate 50. As is shown, the transparent semiconductor nanochip 10B is first provided and brought into proximity to transparent base substrate 50 that contains transparent bond pads 54. The transparent bond pads 52, 54 can be formed by depositing of a transparent bond pad material and thereafter patterning the transparent bond pad material. Next, the transparent semiconductor nanochip 10B is bonded to the transparent base substrate 50 utilizing a bonding anneal, as described above. This process of picking a transparent semiconductor nanochip or transparent element and bonding may be repeated to provide a transparent electronic structure of the present application.

Figure 14:
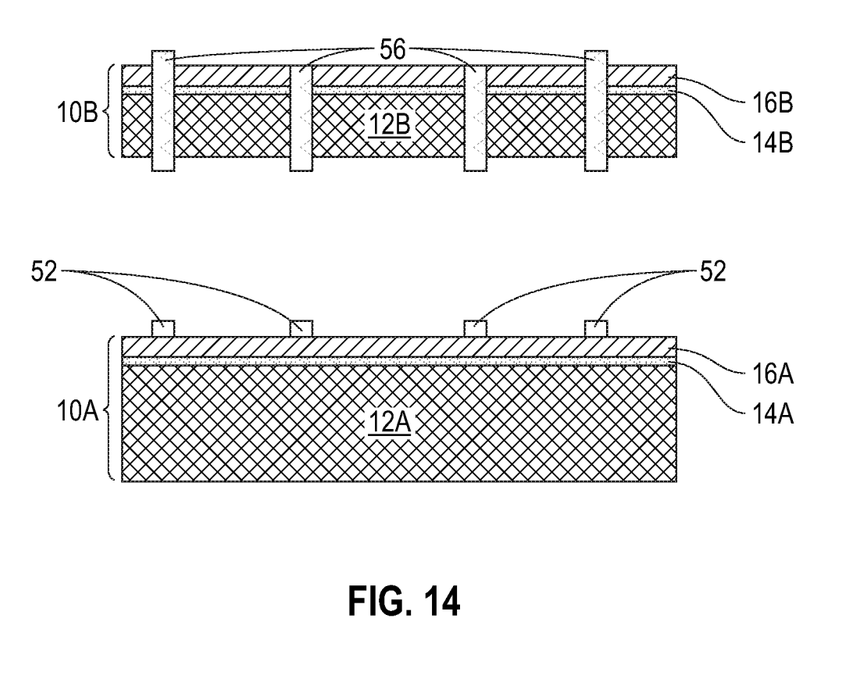
FIG. 14 is a cross sectional view during an early stage of fabricating the exemplary transparent electronic system of FIG. 3.

Referring now FIG. 14, there is illustrated an early stage of fabricating the exemplary transparent electronic system of FIG. 3. Notably, FIG. 14 shows transparent semiconductor nanochip 10A that has been processed to include transparent bond pads 52. The transparent bond pads 52 can be formed by deposition of a transparent bond pad material and thereafter patterning the transparent bond pad material. FIG. 14 also shows transparent semiconductor nanochip 10B processed to include transparent TSVs 56. The transparent TSV can be formed by providing a via within the semiconductor nanochip and then filling the via with a transparent conductive material. The processed chips shown in FIG. 14 are then bonded together utilizing a bonding anneal as defined above. Other elements/components of the transparent electronic system can be selected and then processes to include TSVs 56 and bonded in a stack like manner. The last element of the transparent electronic system is processed to include transparent bond pads and then it is bonded to the TSVs of the underlying element.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A transparent semiconductor nanochip comprising:
a transparent substrate;
a transparent semiconductor material layer located on a surface of the transparent substrate and comprising one or more transparent semiconductor devices disposed thereon; and
a transparent back-end-of-the-line (BEOL) structure disposed entirely above the transparent semiconductor material layer and the one or more transparent semiconductor devices, wherein the transparent BEOL structure comprises at least one interconnect level containing at least one electrically conductive and transparent metallic structure embedded in a transparent interconnect dielectric material layer, and wherein the transparent semiconductor nanochip is invisible to visible light and cannot be seen by a human eye.

2. The transparent semiconductor nanochip of claim 1, wherein the one or more transparent semiconductor devices provides a memory function.

3. The transparent semiconductor nanochip of claim 1, wherein the one or more transparent semiconductor devices provides a processor function.

4. The transparent semiconductor nanochip of claim 1, wherein the transparent semiconductor material layer has a thickness of less than 100 nm.

5. The transparent semiconductor nanochip of claim 1, wherein the transparent semiconductor nanochip has a size of 5 cubic millimeters or less.

6. A transparent electronic system comprising:
a transparent semiconductor nanochip having processor functions;
a transparent semiconductor nanochip having memory functions;
at least one transparent communication element; and
at least one transparent energy harvesting element, wherein each transparent semiconductor nanochip, the at least one transparent communication element and the at least one transparent energy harvesting element are spaced apart from each other, and wherein each transparent semiconductor nanochip includes a transparent substrate, a transparent semiconductor material layer located on a surface of the transparent substrate and comprising one or more transparent semiconductor devices disposed thereon, and a transparent back-end-of-the-line structure disposed entirely above the transparent semiconductor material layer and the one or more transparent semiconductor devices, wherein the transparent BEOL structure comprises at least one interconnect level containing at least one electrically conductive and transparent metallic structure embedded in a transparent interconnect dielectric material layer, and wherein each transparent semiconductor nanochip is invisible to visible light and cannot be seen by a human eye.

7. The transparent electronic system of claim 6, wherein each transparent semiconductor nanochip, the at least one transparent communication element, and the at least one transparent energy harvesting element are arranged in a side-by side configuration on a surface of a transparent base substrate.

8. The transparent electronic system of claim 7, wherein each transparent semiconductor nanochip, the at least one transparent communication element, and the at least one transparent energy harvesting element are stacked one atop the another.

9. The transparent electronic system of claim 6, wherein each transparent semiconductor nanochip, the at least one transparent communication element, and the at least one transparent energy harvesting element has a size of 5 cubic millimeters or less.

10. The transparent electronic system of claim 6, wherein the transparent semiconductor material layer has a thickness of 100 nm or less.

11. The transparent electronic system of claim 6, wherein the at least one transparent energy harvesting element comprises a transparent battery or a transparent photovoltaic cell.

12. The transparent electronic system of claim 6, wherein the at least one transparent communication element comprises a transparent light emitting element.

13. A method of forming a transparent semiconductor nanochip, the method comprising:
providing a semiconductor-on-insulator substrate comprising a transparent semiconductor layer having one or more transparent semiconductor devices disposed thereon;
forming a transparent back-end-of-the-line (BEOL) structure on a first surface of the transparent semiconductor material layer;

physically exposing a second surface of the transparent semiconductor layer that is opposite the first surface, wherein the physically exposing of the second surface of the transparent semiconductor material comprises removing a handle substrate and a buried insulator layer of the semiconductor-on-insulator substrate;

bonding the second surface of the transparent semiconductor material layer to a transparent substrate to provide a bonded structure; and singulating the bonded structure to provide a plurality of transparent semiconductor nanochips, wherein each transparent semiconductor nanochip comprises a remaining sub-unit portion of the transparent substrate, a remaining sub-unit portion of the transparent semiconductor material layer comprising the one or more transparent semiconductor devices disposed thereon, and a remaining sub-unit portion of the transparent BEOL structure.

14. The method of claim 13, wherein the removing of the handle substrate comprises a spalling process.

15. The method of claim 13, wherein at least one of the transparent semiconductor nanochips is bonded to a transparent base substrate.

16. The method of claim 13, forming comprising forming a through-substrate-via in at least one of the transparent semiconductor nanochips and stacking at least one transparent element above the at least one transparent semiconductor nanochip, wherein the at least transparent semiconductor nanochip is bonded to a transparent bond pad of an underlying transparent semiconductor nanochip.

17. The method of claim 13, wherein each transparent semiconductor nanochip of the plurality of transparent semiconductor nanochips has a size of 5 cubic millimeters or less.

18. The method of claim 14, wherein the spalling process comprises:

forming a stressor layer on a surface of transparent BEOL structure; and removing a portion of the handle substrate utilizing the stressor layer to initiate crack formation and propagation within the handle substrate.

19. The method of claim 16, wherein the at least transparent semiconductor nanochip provides a different function than that of the underlying transparent semiconductor nanochip.

* * * * *